(12) United States Patent
Bang et al.

(10) Patent No.: US 11,556,150 B2
(45) Date of Patent: Jan. 17, 2023

(54) DISPLAY DEVICE

(71) Applicant: LG Display Co., Ltd., Seoul (KR)

(72) Inventors: Juyoung Bang, Paju-si (KR); Jonghyun Park, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 17/109,818

(22) Filed: Dec. 2, 2020

(65) Prior Publication Data
US 2021/0173446 A1   Jun. 10, 2021

(30) Foreign Application Priority Data

Dec. 10, 2019  (KR) .................. 10-2019-0163662

(51) Int. Cl.
*G06F 1/16* (2006.01)
*G06F 1/18* (2006.01)
*H01L 51/00* (2006.01)

(52) U.S. Cl.
CPC ............ *G06F 1/1652* (2013.01); *G06F 1/181* (2013.01); *H01L 51/0097* (2013.01)

(58) Field of Classification Search
CPC ... G06F 1/1652; G06F 1/181; H01L 51/0097; H01L 27/3227; H01L 27/326; H01L 27/3225; H01L 27/3234; H01L 27/3244; H01L 51/52; H01L 2251/5338; H04M 1/026; H04M 1/0266
See application file for complete search history.

(56) References Cited

U.S. PATENT DOCUMENTS

| | | | |
|---|---|---|---|
| 8,644,031 B2 | 2/2014 | Chen et al. | |
| 9,543,364 B2 * | 1/2017 | Rappoport | ............ H04R 1/028 |
| 9,691,995 B2 | 6/2017 | Choi et al. | |
| 10,580,729 B2 | 3/2020 | Hsieh et al. | |

(Continued)

FOREIGN PATENT DOCUMENTS

| | | |
|---|---|---|
| CN | 110061014 A | 7/2019 |
| CN | 110164937 A | 8/2019 |

(Continued)

OTHER PUBLICATIONS

European Patent Office, Extended European Search Report and Opinion, EP Patent Application No. 20210649.8, dated Aug. 23, 2021, 12 pages.

(Continued)

*Primary Examiner* — Rockshana D Chowdhury
(74) *Attorney, Agent, or Firm* — Fenwick & West LLP

(57) ABSTRACT

The present disclosure relates to a display device including: a flexible substrate including an active area and a bezel area disposed outside the active area, the active area including a module area in which multiple holes are provided; a back plate disposed on one surface of the flexible substrate, and being provided with an opening disposed in a manner that corresponds to the module area; a thin-film transistor and wire formation layer disposed on another surface of the flexible substrate, and including multiple light-transmitting areas disposed in a manner that corresponds to the opening; and a module received within the opening of the back plate, wherein the module receives light from outside through the multiple light-transmitting areas, the multiple holes, and the opening.

20 Claims, 10 Drawing Sheets

(56) References Cited

U.S. PATENT DOCUMENTS

| | | | |
|---|---|---|---|
| 10,756,136 B1 | 8/2020 | Ma et al. | |
| 11,048,294 B2* | 6/2021 | Yin | G02F 1/133528 |
| 11,121,330 B2 | 9/2021 | Li | |
| 11,137,645 B2* | 10/2021 | Baek | G02F 1/1339 |
| 2011/0205722 A1 | 8/2011 | Chen et al. | |
| 2016/0204365 A1 | 7/2016 | Choi et al. | |
| 2018/0090698 A1 | 3/2018 | Jeong et al. | |
| 2018/0315803 A1* | 11/2018 | Jin | G06V 40/13 |
| 2019/0205596 A1 | 7/2019 | Kim et al. | |
| 2019/0252298 A1 | 8/2019 | Hsieh et al. | |
| 2020/0403168 A1* | 12/2020 | Li | H01L 27/3276 |
| 2021/0036071 A1* | 2/2021 | Zhang | H01L 51/0096 |
| 2021/0255665 A1* | 8/2021 | Yoo | H04M 1/0216 |

FOREIGN PATENT DOCUMENTS

| | | |
|---|---|---|
| CN | 110491912 A | 11/2019 |
| TW | 201129951 A | 9/2011 |
| TW | 201834232 A | 9/2018 |
| TW | 201905652 A | 2/2019 |
| TW | 201935620 A | 9/2019 |
| WO | WO 2015/084073 A1 | 6/2015 |

OTHER PUBLICATIONS

Second Office Action with concise explanation of relevance, Taiwanese Patent Application No. 109141009, dated Feb. 22, 2022, 7 pages.

* cited by examiner

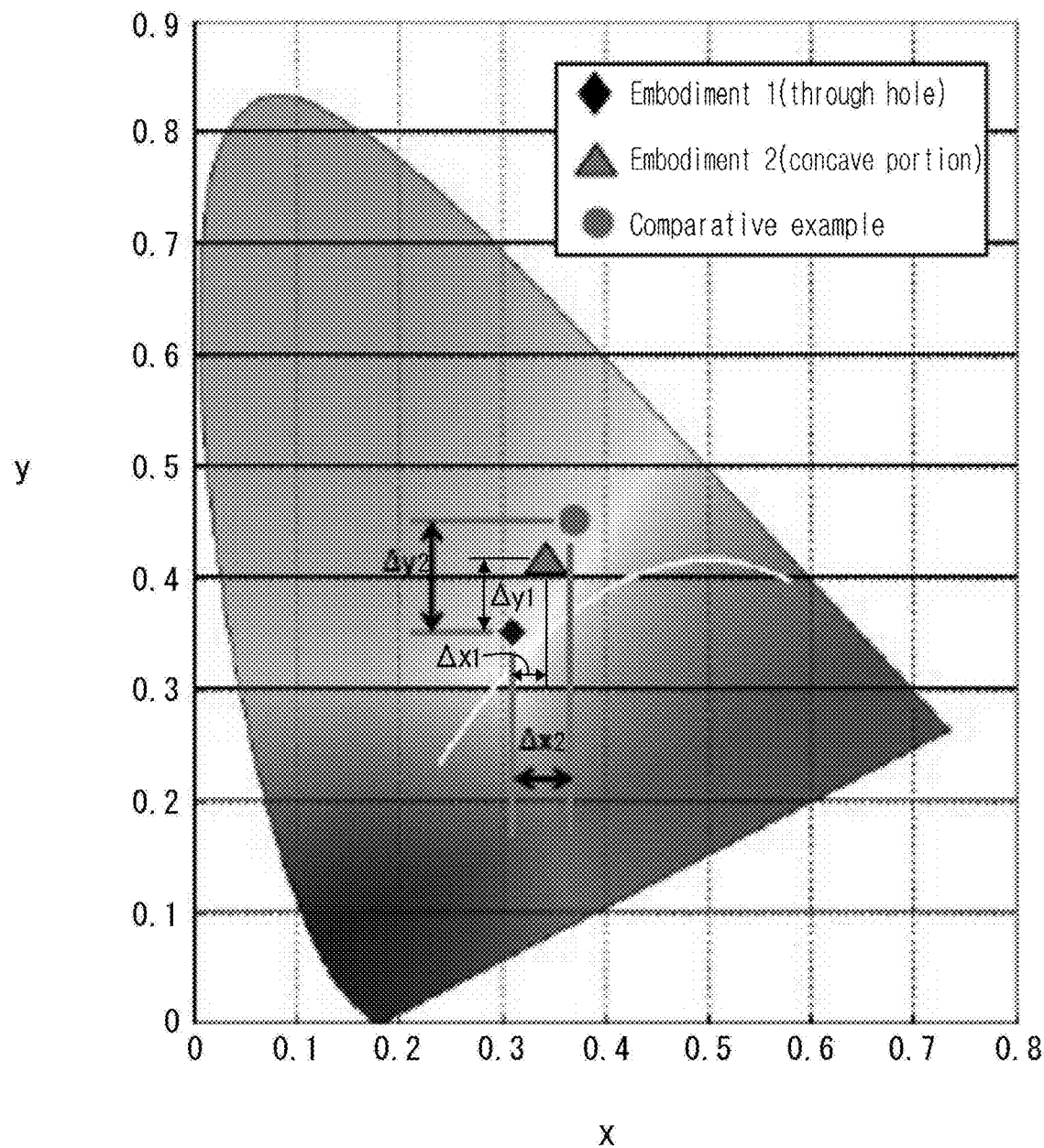

| Conditions | x | Δx | y | Δy | Remarks |
|---|---|---|---|---|---|
| Embodiment 1 (through hole) | 0.310 | – | 0.351 | – | Change in color coordinates: none |
| Embodiment 2 (concave portion) | 0.369 | 0.059 | 0.416 | 0.065 | Change in color coordinates: small |
| Comparative example | 0.381 | 0.071 | 0.444 | 0.093 | Change in color coordinates: large |

DISPLAY DEVICE

CROSS REFERENCE TO RELATED APPLICATION

The present application claims priority to Republic of Korea Patent Application No. 10-2019-0163662, filed Dec. 10, 2019, which is incorporated by reference in its entirety.

BACKGROUND

Field of Technology

The present disclosure relates to a display device.

Description of the Related Art

As information society has developed, demands for a display device displaying an image have increased in various forms. For example, a flat-panel display (FPD), which is thin and light and may be implemented in a large size, has been rapidly developed, replacing a cathode-ray tube (CRT), which is bulky. As such a flat-panel display, a variety of flat-panel displays, such as a liquid crystal display (LCD), a plasma display panel (PDP), an electroluminescent (EL) display, a field-emission display (FED), and an electrophoretic display (EPD), has been developed and utilized.

Such display devices include a display panel, a driver, a power supply, and the like. The display panel includes display elements for displaying information, the driver drives the display panel, and the power supply generates power to be supplied to the display panel and the driver.

In addition, in such display devices, various elements, such as a camera, a sensor, and the like, for implementing a multimedia function are introduced in the form of a module. In general, these elements are disposed outside a display area.

However, the disposition of the camera, and the like, outside the display area has a problem of increasing the bezel part.

The foregoing is intended merely to aid in the understanding of the background of the present disclosure, and is not intended to mean that the present disclosure falls within the purview of the related art that is already known to those skilled in the art.

SUMMARY

The present disclosure provides a display device that is capable of being provided with a module, such as a camera, and the like, without an increase in the size of a bezel part of the display device, and enabling the module not to be visible.

According to a first feature of the present disclosure, there is provided a display device including: a flexible substrate including an active area and a bezel area disposed outside the active area, the active area including a module area in which multiple holes are provided; a back plate disposed on one surface of the flexible substrate, and being provided with an opening disposed in a manner that corresponds to the module area; a thin-film transistor and wire formation layer disposed on another surface of the flexible substrate, and including multiple light-transmitting areas disposed in a manner that corresponds to the opening; and a module received within the opening of the back plate, wherein the module receives light from outside through the multiple light-transmitting areas, the multiple holes, and the opening.

According to a second feature of the present disclosure, there is provided a display device including: a back plate including an active area and a bezel area disposed outside the active area, the active area including a module area in which an opening is provided; a first flexible substrate, an insulation layer, and a second flexible substrate sequentially stacked on one surface of the back plate; a thin-film transistor and wire formation layer disposed on one surface of the second flexible substrate, and including multiple light-transmitting areas disposed in a manner that corresponds to the opening; and a module received within the opening of the back plate, wherein at least one among the first flexible substrate and the second flexible substrate is provided with multiple holes that correspond to the multiple light-transmitting areas, respectively, and the module receives light from outside through the multiple light-transmitting areas, the multiple holes, and the opening.

According to the display device of the present disclosure, since the module, such as a camera, a sensor, and the like, is disposed to be received in the opening of the back plate positioned in the display area, an increase in the size of the bezel part is prevented.

In addition, the module is received in the opening of the back plate and is thus not exposed to outside.

In addition, the multiple holes are formed in the flexible substrate in such a manner as to correspond to the opening of the back plate, and the multiple light-transmitting areas are formed in the thin-film transistor and wire formation layer, and the opening, the multiple holes, and the multiple light-transmitting area are disposed to overlap each other, so that the change in color of light entering the module received in the opening of the back plate is reduced and thus sensitivity to light entering the module is increased.

BRIEF DESCRIPTION OF THE DRAWINGS

The above and other objectives, features, and other advantages of the present disclosure will be more clearly understood from the following detailed description when taken in conjunction with the accompanying drawings, in which:

FIG. 9 is a chromaticity diagram showing changes in color characteristic in cases where a flexible substrate of a display device according to the present disclosure is provided with holes, and in a case, as a comparative example for comparison, where the flexible substrate is not provided with holes.

DETAILED DESCRIPTION

Figure 1:
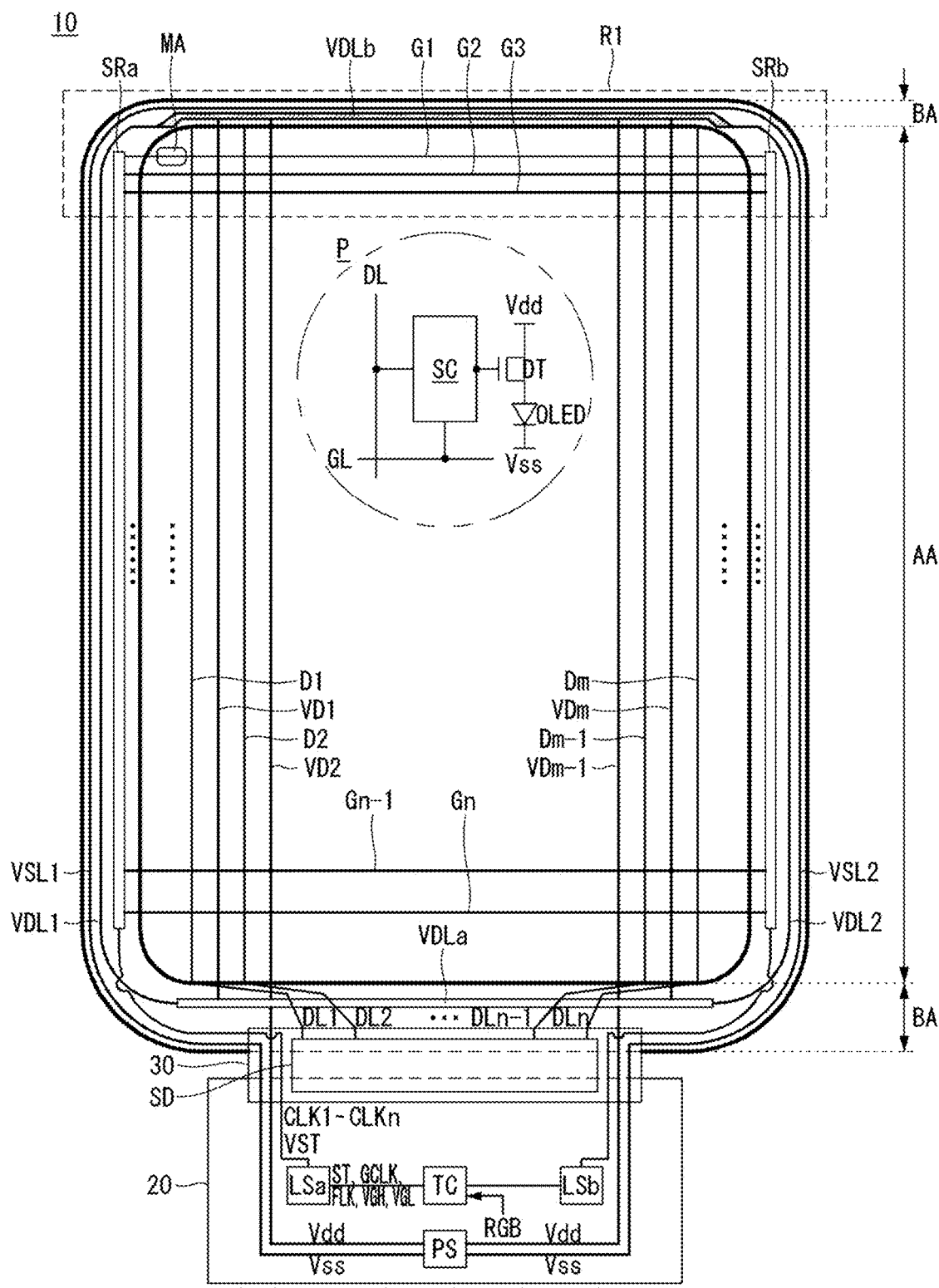
FIG. 1 is a plan view schematically showing a display device according to an embodiment of the present disclosure.

Advantages and features of the present disclosure, and methods to achieve these will be apparent from the following embodiments that will be described in detail with reference to the accompanying drawings. It should be understood that the present disclosure is not limited to the following embodiments and may be embodied in different ways, and that the embodiments are given to provide complete the present disclosure and to provide a thorough understanding of the present disclosure to those skilled in the art. The scope of the present disclosure is defined only by the claims.

The shapes, sizes, ratios, angles, numbers, and the like illustrated in the accompanying drawings for describing embodiments of the present disclosure are merely examples, and the present disclosure is not limited thereto. Throughout the description, the same reference numerals refer to same elements. In addition, in describing the present disclosure, if it is decided that the detailed description of the known art related to the present disclosure makes the subject matter of the present disclosure unclear, the detailed description will be omitted.

The terms such as "including", "having", and "comprising" used herein are generally intended to allow other components to be added unless the terms are used with the term "only". The terms of a singular form may include plural forms unless specifically stated otherwise.

In construing an element, the element is construed as including an error range although there is no explicit description.

In describing a position relationship, for example, when the position relationship between two parts is described using the terms such as "on", "above", "below", "next", and the like, one or more other parts may be positioned between the two parts unless the term "immediately" or "directly" is used.

In describing a time relationship, for example, when the temporal order relationship is described using the terms such as "after", "subsequent to", "next", "before", and the like, a case which is not continuous may be included unless the term "immediately" or "directly" is used.

It is noted that the terms "first", "second", etc. may be used to describe various elements, but these elements are not limited by these terms. These terms are only used to distinguish one element from another element. Accordingly, a first element described below could be termed a second element without departing from the technical idea of the present disclosure.

An "X-axis direction", a "Y-axis direction", and a "Z-axis direction" should not be construed as only a geometric relationship where a relationship therebetween is vertical, and may denote having a broader directionality within a scope where elements of the present disclosure operate functionally.

The phrase "at least one" should be understood as including any combination possible from one or more related items. For example, the meaning of "at least one among a first item, a second item, and a third item" denotes the first item, the second item, or the third item as well as any combination of two or more items selected from a group of the first item, the second item, and the third item.

Features of various embodiments of the present disclosure can be partially or overall coupled to or combined with each other, and can variously inter-operate with each other and be driven technically. The embodiments of the present disclosure can be performed independently from each other, or can be performed together in co-dependent relationship.

Hereinafter, a display device according to an embodiment of the present disclosure will be described with reference to FIGS. 1 to 4.

Figure 2:
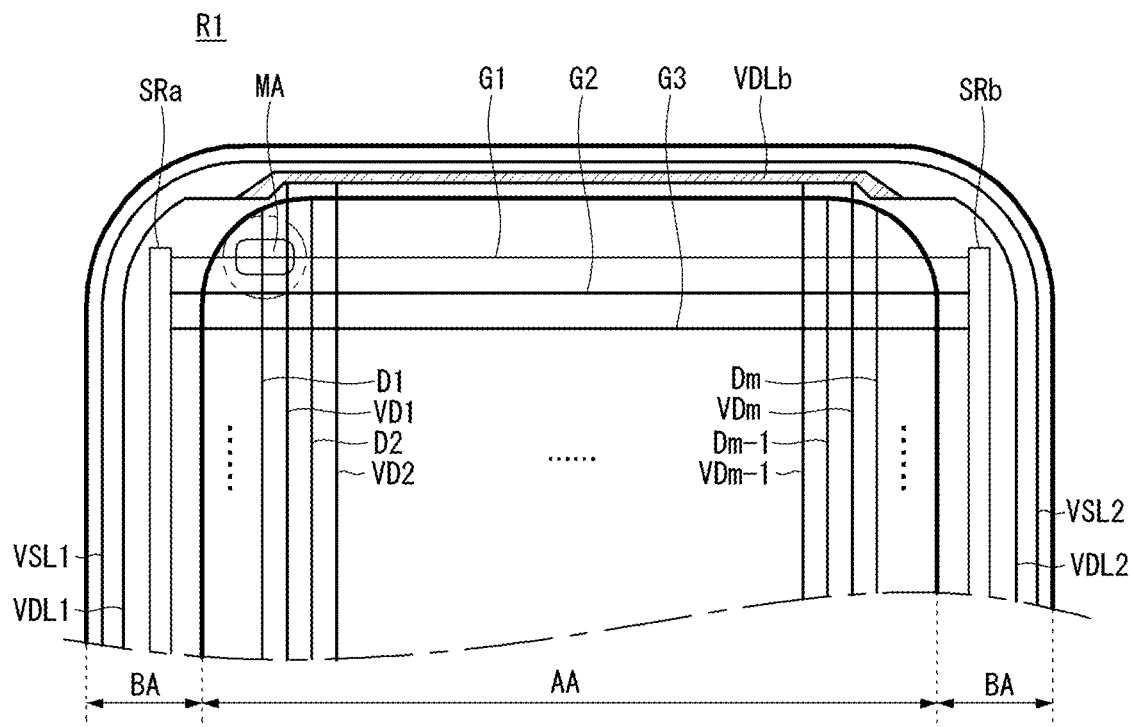
FIG. 2 is a plan view showing a portion of the display panel shown in FIG. 1 in more detail according to an embodiment of the present disclosure.

FIG. 1 is a plan view schematically showing a display device according to an embodiment of the present disclosure. FIG. 2 is a plan view schematically showing a portion of the display panel shown in FIG. 1, and is the plan view including an enlarged view of a module area.

Referring to FIGS. 1 and 2, a display device according to an embodiment of the present disclosure may include a display panel 10, a data driver, a gate driver, a power supply PS, a timing controller TC, and the like.

The display panel 10 includes an active area AA on which information is displayed, and a bezel area BA on which information is not displayed.

The active area AA is an area on which an input image is displayed, and an area in which a pixel array of multiple pixels P arranged in a matrix type is disposed.

The bezel area BA is an area in which shift registers SRa and SRb of a gate driving circuit, various link signal wires (for example, DL1 to DLn), link power supply lines VDL1, VDL2, VSL1, and VSL2, power supply electrodes VDLa and VDLb, and the like are disposed. The pixel array disposed in the active area AA includes multiple data lines D1 to Dm and multiple gate lines G1 to Gn, which are disposed to intersect with each other, and pixels P disposed at all the intersection regions in a matrix form.

Each of the pixels P includes a light-emitting diode (LED), a driving thin-film transistor (hereinafter, referral to as a driving TFT (DT)) controlling the amount of current flowing to the light-emitting diode (LED), and a programming part (SC) for setting a voltage between a gate and a source of the driving TFT (DT). From the power supply PS, the pixels P of the pixel array receive first power Vdd, which is a high-potential voltage, through first-power lines VD1 to VDm, and receive second power Vss, which is a low-potential voltage, through second-power lines VSL1 to VSL2.

The first-power lines VD1 to VDm receive the first power Vdd from the power supply PS through the lower first-power supply electrode VDLa and the upper first-power supply electrode VDLb on opposite sides. The lower first-power supply electrode VDLa is disposed in the bezel area BA on the side where a chip-on film 30 is attached, and the upper first-power supply electrode VDLb is disposed in the opposite bezel area. The opposite end portions of the lower first-power supply electrode VDLa and the upper first-power supply electrode VDLb are connected with each other via the link wires VDL1 and VDL2. Accordingly, it is possible to minimize deterioration in display quality caused by an increase in resistance capacitance (RC) depending on the positions of pixels disposed in the active area AA.

The programming part SC may include at least one switch TFT, and at least one storage capacitor. The switch TFT is turned on in response to a scan signal from a gate line GL, and thus applies a data voltage from the data lines D1 to Dm to an electrode on one side of the storage capacitor. The driving TFT (DT) controls the amount of current supplied to the light-emitting diode (OLED) according to the magnitude of the voltage with which the storage capacitor is charged, and thus adjusts the amount of light emitted from the light-emitting diode (OLED). The amount of light emitted from the light-emitting diode (OLED) is proportional to the amount of current supplied from the driving TFT (DT).

The TFTs constituting a pixel may be implemented in p type or n type. In addition, a semiconductor layer of the TFTs constituting a pixel may include amorphous silicon, polysilicon, or oxide. The light-emitting diode (LED) includes an anode electrode, a cathode electrode, and a light-emitting structure interposed between the anode electrode and the cathode electrode. The anode electrode is connected to the driving TFT (DT). The light-emitting structure includes an emission layer (EML). With the emission layer interposed, on one side thereof, a hole injection layer (HIE) and a hole transport layer (HTL) are disposed, and on the opposite side, an electron transport layer (ETL) and an electron injection layer (EIL) are disposed.

The data driver is equipped with a data IC (SD). One side is connected to one end portion of a source printed circuit board 20, and another side includes the chip-on film 30 attached on the bezel area BA of the display panel 10.

The data IC (SD) generates a data voltage by converting digital video data input from the timing controller TC, to an analog gamma compensation voltage. The data voltage output from the data IC (SD) is supplied to the data lines D1 to Dm through the data links DL1 to DLn.

For the gate driver, a type in which a chip-on film equipped with a gate IC is disposed on one side of the display panel, or a GIP type in which a gate IC is formed on the display panel may be used. In the present disclosure, a GIP-type gate driver will be described as an example.

The GIP-type gate drivers includes level shifters LSa and LSb, which are mounted on the source printed circuit board 20, and the shift registers SRa and SRb, which are provided on the bezel area BA of the display panel 10 and receive signals supplied from the level shifters LSa and LSb.

The level shifters LSa and LSb receive signals, such as a start pulse ST, gate shift clocks GCLK, a flicker signal FLK, and the like, from the timing controller TC, and also receive driving voltages, such as a gate high voltage VGH, a gate low voltage VGL, and the like. The start pulse ST, the gate shift clocks GCLK, and the flicker signal FLK are signals swinging between approximately 0 V and 3.3 V. The gate shift clocks GCLK are n-phase clock signals having a predetermined phase difference. The gate high voltage VGH is a voltage that is equal to or greater than a threshold voltage of a thin-film transistor (TFT) provided in an array of thin-film transistors of the display panel 10, and is a voltage of about 28 V. The gate low voltage VGL is a voltage that is less than the threshold voltage of the thin-film transistor (TFT) provided in the array of thin-film transistors of the display panel 10, and is a voltage of about −5 V.

The level shifters LSa and LSb output shift clock signals CLK that result from level shift of the start pulse ST and each of the gate shift clocks GCLK input from the timing controller TC by using the gate high voltage VGH and the gate low voltage VGL. Therefore, each of a start pulse VST and the shift clock signals CLK output from the level shifters LSa and LSb swing between the gate high voltage VGH and the gate low voltage VGL. The level shifters LSa and LSb may lower the gate high voltage according to the flicker signal FLK and may thus lower a kick-back voltage ($\Delta Vp$) of a liquid crystal cell, thereby reducing flicker.

Output signals of the level shifters LSa and LSb may be supplied to the shift registers SRa and SRb through wires formed on the chip-on film 30 in which the source driver IC (SD) is disposed, and line-on-glass (LOG) wires formed on a substrate of the display panel 10. The shift registers SRa and SRb may be formed directly on the bezel area BA of the display panel 10 by a GIP process.

The shift registers SRa and SRb shift the start pulse VST input from the level shifters LSa and LSb according to the shift clock signals CLK1 to CLKn, and thus sequentially shifts a gate pulse swinging between the gate high voltage VGH and the gate low voltage VGL. The gate pulses output from the shift registers SRa and SRb are supplied sequentially to the gate lines G1 to Gn.

The timing controller TC receives, from a host system (not shown), a timing signal, such as a vertical synchronization signal, a horizontal synchronization signal, a data enable signal, a main clock, and the like, and synchronizes operation timing of the data IC (SD) and the gate drivers. Data timing control signals for controlling the data IC (SD) may include a source sampling clock (SSC), a source output enable (SOE) signal, and the like. Gate timing control signals for controlling the gate drivers may include a gate start pulse (GSP), a gate shift clock (GSC), a gate output enable (GOE) signal, and the like.

Although FIG. 1 shows a configuration in which the shift registers SRa and SRb are disposed on opposite sides, respectively, outside the active area AA and supply gate pulses to the gate lines G1 to Gn, at opposite end portions of the active area AA, the present disclosure is not limited to this. The shift register may be disposed on only one side of the active area AA and may supply the gate pulses to the gate lines G1 to Gn, on the one side of the active area AA. When the shift registers SRa and SRb are disposed on the opposite sides, respectively, outside the active area AA, gate pulses having the same phase and the same amplitude are supplied to the gate lines disposed on the same horizontal line of the pixel array.

Referring to FIG. 2, the display panel 10 of the present disclosure includes the active area AA and the bezel area BA outside the active area AA.

The active area AA is an area in which a pixel array for displaying information, such as text, figures, pictures, photos, images, and the like, is disposed. The active area AA may include at least one module area MA disposed in the active area AA. The module area MA may be disposed anywhere in the active area AA.

The module area MA is an area in which a camera, a speaker, a sensor, and the like are disposed. The module area MA may include: at least one pixel P; a thin-film transistor provided to supply a signal to each pixel P; a signal wire including a gate line (for example, G1) and a data line (for example, D1) that are connected to the thin-film transistor and disposed to intersect with each other; and a light-transmitting area (TA) disposed away from the lines.

The bezel area BA is an area surrounding the active area AA outside the active area AA, and is an area in which the following is disposed: the shift registers SRa and SRb for generating gate pulses to be supplied to the pixel array of the active area AA; signal wires for supplying various types of signals; and power supply wires for supplying various types of power.

Hereinafter, with reference to FIGS. 3 and 4, the module area of the display device according to an embodiment of the present disclosure will be described in detail.

Figure 3:
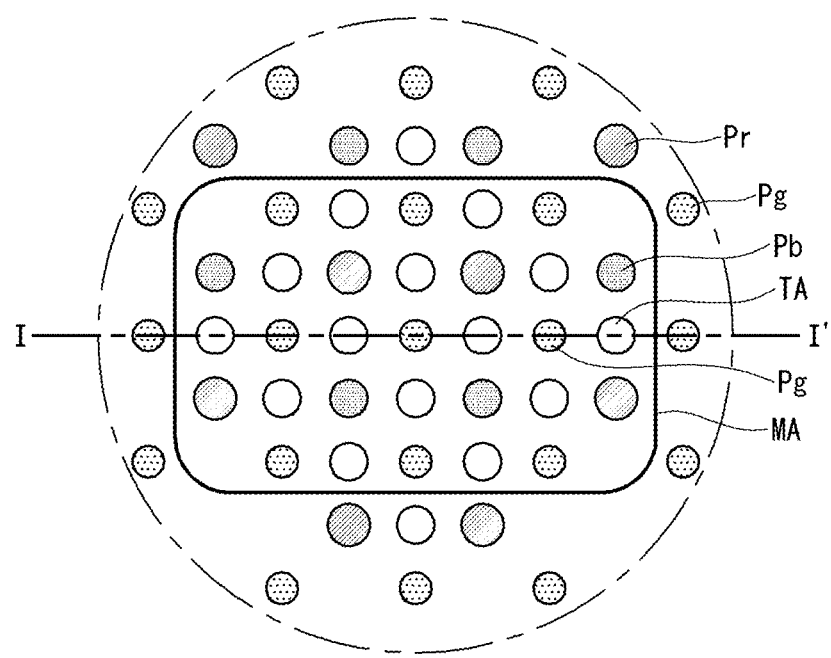
FIG. 3 is a plan view showing a module area shown in FIG. 2 according to an embodiment of the present disclosure.

FIG. 3 is a plan view showing a module area of a display device according to an embodiment of the present disclosure. FIG. 4 is a cross-sectional view taken along line I-I' of FIG. 3.

Figure 4:
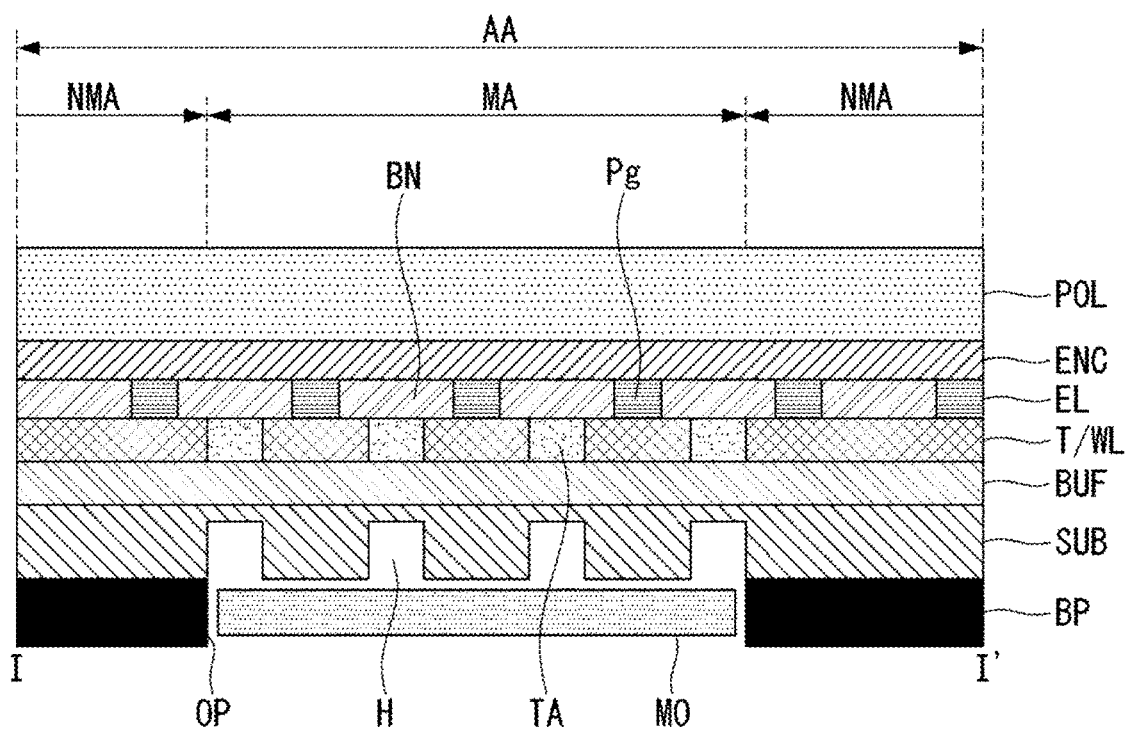
FIG. 4 is a cross-sectional view taken along line I-I' shown in FIG. 3 according to an embodiment of the present disclosure.

Referring to FIGS. 3 and 4, the module area MA includes multiple pixels Pr, Pg, and Pb, and multiple light-transmitting areas TA disposed between the adjacent pixels (Pr and Pg, Pg and Pb, or Pb and Pr), and the non-module area NMA is outside the module area MA. In each of the light-transmitting areas TA, a signal line or thin-film transistor connected to each of the pixels Pr, Pg, and Pb is not disposed.

The module area MA includes: a back plate BP; a flexible substrate SUB disposed on the back plate BP; a buffer layer BUF disposed on the flexible substrate SUB; a thin-film transistor and wire formation layer T/WL formed on the buffer layer; an light-emitting element layer EL disposed on the thin-film transistor and wire formation layer T/WL; an encapsulation layer ENC disposed on the light-emitting element layer EL; and a polarizing film POL disposed on the encapsulation layer ENC.

The back plate BP is provided with an opening OP in which a module MO, such as a camera, and a sensor, is received. The opening OP in the back plate BP may be formed to completely expose the flexible substrate SUB positioned on the top of the back plate BP. In the case where the flexible substrate SUB is too thin, the back plate BP is disposed on the rear surface of the display device to keep the display device flat. In addition, the back plate BP reduces adhesion of foreign matter to the flexible substrate SUB, and cushions the impact applied from outside. The back plate BP may be made of a polymer material, such as polyethylene terephthalate (PET), poly carbonate (PC), and polyethylene naphthalate (PEN).

The flexible substrate SUB is provided with multiple holes Hs disposed separately from each other. At least one or some of the multiple holes H formed on the flexible substrate SUB is disposed to overlap the opening OP in the back plate BP. The flexible substrate SUB may be made of a flexible material, for example, polyimide (P1).

The buffer layer BUF may be a single layer composed of any one of inorganic and organic materials so as to prevent a light-emitting element from being damaged by impurities such as alkali ions, and the like that flow out of the flexible substrate SUB. Alternatively, the buffer layer BUF may be multiple layers formed of different inorganic materials, or multiple layers of an organic material layer and an inorganic material layer that are alternately disposed. Examples of the inorganic material layer may include any one among a silicon oxide film (SiOx), and a silicon nitride film (SiNx). Examples of the organic material may include photoacrylic. However, the inorganic material and the organic material are not limited to the above-described materials.

The thin-film transistor and wire formation layer T/WL includes: thin-film transistors and wires formed to supply signals to each pixel; and multiple light-transmitting areas TA disposed in the areas where these thin-film transistors and wires are not formed. The multiple light-transmitting areas TA of the thin-film transistor and wire formation layer T/WL are disposed in a manner that the multiple light-transmitting areas TAs respectively correspond to the multiple holes H in the flexible substrate SUB. That is, the multiple light-transmitting areas TA and the multiple holes H are disposed in a manner that they overlap with each other. In the display device, the thin-film transistors and wires formed to supply signals are general elements, and thus herein, a detailed description thereof will be omitted.

The light-emitting element layer EL may include the multiple pixels Pr, Pg, and Pb, and a bank BN that divides the multiple pixels Pr, Pg, and Pb and has high light transmittance. The multiple pixels Pr, Pg, and Pb are disposed not to overlap the multiple light-transmitting areas TA of the thin-film transistor and wire formation layer T/WL and the multiple holes H in the flexible substrate SUB.

Each of the multiple pixels Pr, Pg, and Pb includes an anode electrode, a cathode electrode, and an organic emission layer interposed between the anode electrode and the cathode electrode. The anode electrode (ANO) may be made of a transparent conductive material, such as indium tin oxide (ITO), indium zinc oxide (IZO), or zinc oxide (ZnO). The organic emission layer may include an emission layer (EML). With the emission layer interposed, a hole injection layer (HIL) and a hole transport layer (HTL) may be disposed on one side, and an electron transport layer (ETL) and an electron injection layer (EIL) may be disposed on the other side. The cathode electrode may be made of magnesium (Mg), calcium (Ca), aluminum (Al), silver (Ag), or an alloy thereof, which have a low work function.

The encapsulation layer ENC is a light-transmitting layer and may be formed in a multi-layer structure in which an inorganic material layer and an organic material layer are alternately disposed so as to minimize penetration of moisture or oxygen from outside into the light-emitting elements positioned inward from the encapsulation layer ENC.

The polarizing film POL is a film for preventing deterioration in contrast caused by external light.

In the display device according to the above-described embodiment of the present disclosure, the module MO, such as a camera, a sensor, and the like, is received in the opening OP in the back plate BP. Since the opening OP in the back plate BP is disposed to overlap at least one of the multiple holes H in the flexible substrate SUB and the multiple holes H in the flexible substrate SUB overlap the multiple light-transmitting areas TA, light from outside reaches the module MO through the polarizing film POL, the encapsulation layer ENC, the bank BN of the light-emitting element layer EL, the multiple holes H in the flexible substrate SUB, and the opening OP in the back plate BP. Accordingly, since the module MO, such as a camera, a sensor, or the like, is received in the opening OP in the back plate BP and is positioned within the display area, it is possible to prevent the module MO, such as a camera, a sensor, and the like, from being visible from outside without deterioration in function.

Hereinafter, with reference to FIGS. 5A to 8C, the flexible substrate and the buffer layer of the display device according to embodiments of the present disclosure will be described in detail.

Figure 5A:
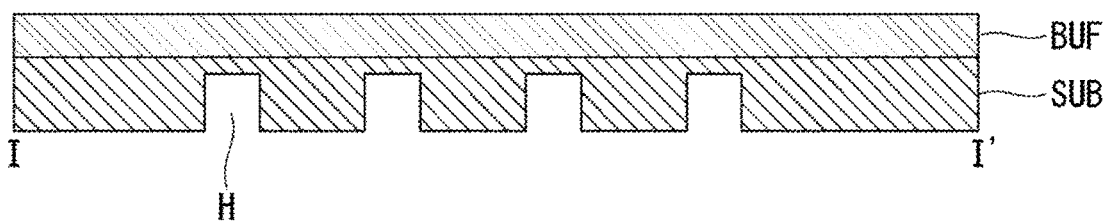
FIGS. 5A to 5C are cross-sectional views showing a first embodiment of a substrate and a buffer layer of a display device shown in FIG. 4.
Figure 5B:
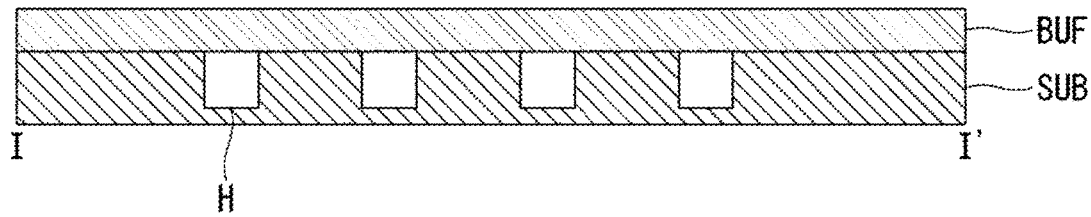
Figure 5C:
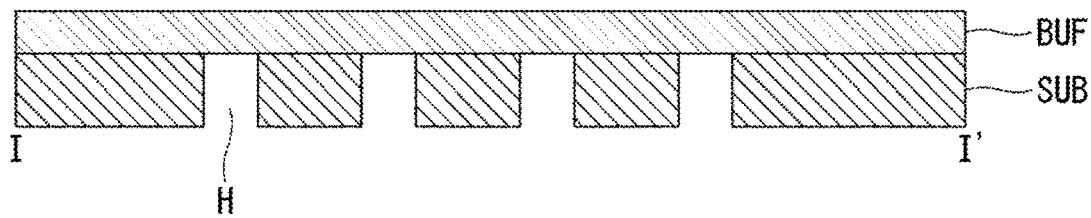

FIGS. 5A to 5C are cross-sectional views showing a first embodiment of the substrate and the buffer layer of the display device shown in FIG. 4. FIGS. 5A to 5C show embodiments of the cases where the flexible substrate is formed of a single layer.

Referring to FIG. 5A, the flexible substrate SUB disposed on the back plate BP is provided with multiple holes H disposed separately from each other. Each of the multiple holes H is formed as a concave portion having a depth less than the thickness of the flexible substrate SUB. The concave portion is open toward the back plate BP and is connected to the opening OP in the back plate BP.

Referring to FIG. 5B, the flexible substrate SUB disposed on the back plate BP is provided with multiple holes H disposed separately from each other. Each of the multiple holes H is formed as a concave portion having a depth less than the thickness of the flexible substrate SUB. The concave portion is open toward the buffer layer BUF and defines a space made airtight by a lower surface of the buffer layer BUF.

Referring to FIG. 5C, the flexible substrate SUB disposed on the back plate BP is provided with multiple holes H disposed separately from each other. Each of the multiple holes H is formed as a through hole penetrating through the flexible substrate SUB. The through hole is open toward the back plate BP and is connected to the opening OP in the back plate BP.

In the first embodiment of FIGS. 5A to 5C, FIGS. 5A and 5B shows the case where the holes H in the flexible substrate are formed as the concave portions, and FIG. 5C shows the case where the holes H in the flexible substrate are formed as the through holes. According to the embodiment of FIGS. 5A and 5B, since a part of the flexible substrate remains in the region of the holes H, shift in color coordinates is reduced and reliability is increased, simultaneously. According to the embodiment of FIG. 5C, since the flexible substrate is not present in the region of the holes H, optical properties (superior transmittance, reduction in color coordinate shift) are superior.

FIGS. 6A to 6D are cross-sectional views showing a second embodiment of the substrate and the buffer layer of the display device shown in FIG. 4. FIGS. 6A to 6D show embodiments of the cases where a flexible substrate is formed in a two-layer structure of a first and a second flexible substrate and multiple holes formed in at least one among the first and the second flexible substrates are formed as concave portions.

Figure 6A:
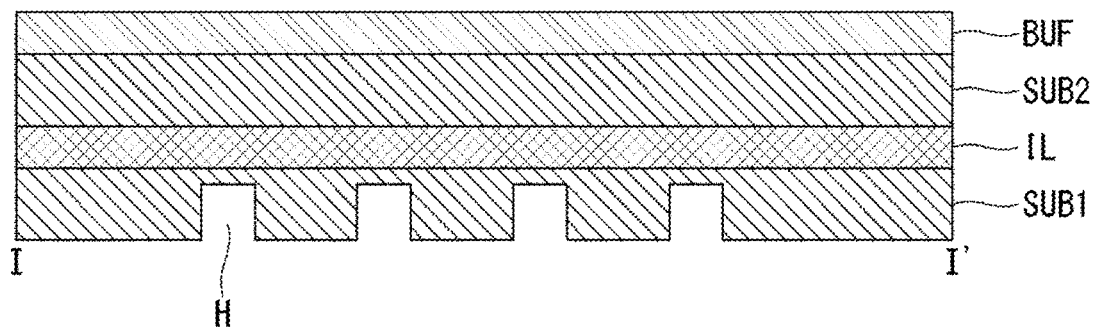
FIGS. 6A to 6D are cross-sectional views showing a second embodiment of a substrate and a buffer layer of a display device shown in FIG. 4.

Referring to FIG. 6A, the flexible substrates disposed on the back plate BP include a first flexible substrate SUB1 and a second flexible substrate SUB2 that are disposed opposite each other, with an insulation layer IL interposed therebetween. The first flexible substrate SUB1 is disposed on an upper surface of the back plate BP, and the second flexible substrate SUB2 is disposed under a lower surface of the buffer layer BUF. The first flexible substrate SUB1 is provided with multiple holes H disposed separately from each other. Each of the multiple holes H is formed as a concave portion having a depth less than the thickness of the first flexible substrate SUB1. The concave portion is open toward the back plate BP and is connected to the opening OP in the back plate BP.

Figure 6B:
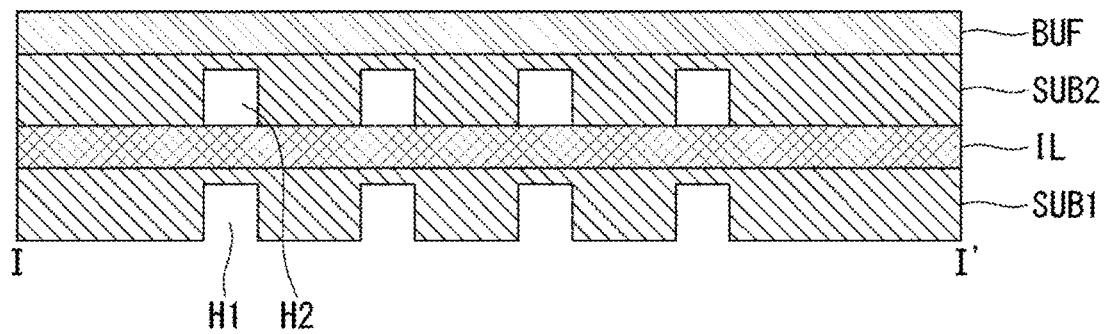

Referring to FIG. 6B, the flexible substrates disposed on the back plate BP include a first flexible substrate SUB1 and a second flexible substrate SUB2 that are disposed opposite each other, with an insulation layer IL interposed therebetween. The first flexible substrate SUB1 is disposed on an upper surface of the back plate BP, and the second flexible substrate SUB2 is disposed under a lower surface of the buffer layer BUF. The first flexible substrate SUB1 is provided with multiple first holes H1 disposed separately from each other. Each of the multiple first holes H1 is formed as a first concave portion having a depth less than the thickness of the first flexible substrate SUB1. The first concave portion is open toward the back plate BP and is connected to the opening OP in the back plate BP. The second flexible substrate SUB2 is provided with multiple second holes H2 disposed separately from each other. Each of the multiple second holes H2 is formed as a second concave portion having a depth less than the thickness of the second flexible substrate SUB2. The second concave portion is open toward the insulation layer IL and defines a space made airtight by an upper surface of the insulation layer IL.

Figure 6C:
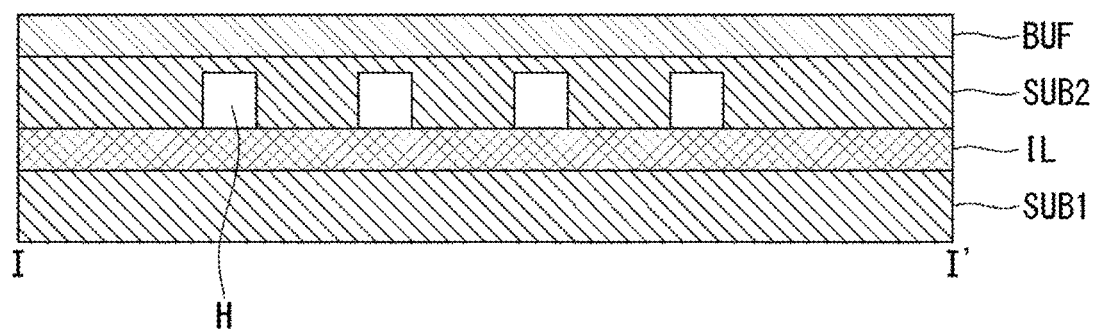

Referring to FIG. 6C, the flexible substrates disposed on the back plate BP include a first flexible substrate SUB1 and a second flexible substrate SUB2 that are disposed opposite each other, with an insulation layer IL interposed therebetween. The first flexible substrate SUB1 is disposed on an upper surface of the back plate BP, and the second flexible substrate SUB2 is disposed under a lower surface of the buffer layer BUF. The second flexible substrate SUB2 is provided with multiple holes H disposed separately from each other. Each of the multiple holes H is formed as a concave portion having a depth less than the thickness of the second flexible substrate SUB2. The concave portion is open toward the insulation layer IL and defines a space made airtight by an upper surface of the insulation layer IL.

Figure 6D:
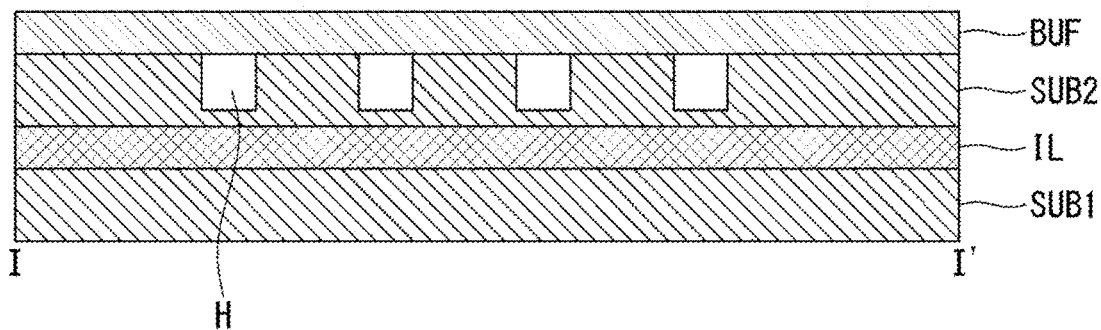

Referring to FIG. 6D, the flexible substrates disposed on the back plate BP include a first flexible substrate SUB1 and a second flexible substrate SUB2 that are disposed opposite each other, with an insulation layer IL interposed therebetween. The first flexible substrate SUB1 is disposed on an upper surface of the back plate BP, and the second flexible substrate SUB2 is disposed under a lower surface of the buffer layer BUF. The second flexible substrate SUB2 is provided with multiple holes H disposed separately from each other. Each of the multiple holes H is formed as a concave portion having a depth less than the thickness of the second flexible substrate SUB2. The concave portion is open toward the buffer layer BUF and defines a space made airtight by a lower surface of the buffer layer BUF.

The second embodiment of FIGS. 6A to 6D shows the examples of the cases where a flexible substrate is formed in a two-layer structure and holes H are formed as concave portions, and various combinations other than these are possible. In the second embodiment of FIGS. 6A to 6D, since the holes H are formed as the concave portions, only a part of the flexible substrate remains in the region of the holes H. Accordingly, shift in color coordinates is reduced and reliability is increased, simultaneously.

FIGS. 7A to 7D are cross-sectional views showing a third embodiment of the substrate and the buffer layer of the display device shown in FIG. 4. FIGS. 7A to 7D show embodiments of the cases where a flexible substrate is formed in a two-layer structure of a first and a second flexible substrate and all multiple holes formed in at least one among the first and the second flexible substrates are formed as through holes.

Figure 7A:
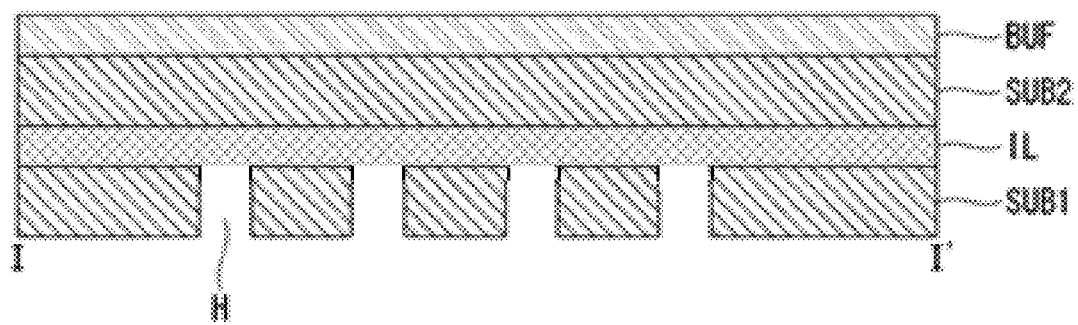
FIGS. 7A to 7D are cross-sectional views showing a third embodiment of a substrate and a buffer layer of a display device shown in FIG. 4.

Referring to FIG. 7A, the flexible substrates disposed on the back plate BP include a first flexible substrate SUB1 and a second flexible substrate SUB2 that are disposed opposite each other, with an insulation layer IL interposed therebetween. The first flexible substrate SUB1 is disposed on an upper surface of the back plate BP, and the second flexible substrate SUB2 is disposed under a lower surface of the buffer layer BUF. The first flexible substrate SUB1 is provided with multiple holes H disposed separately from each other. Each of the multiple holes H is formed as a through hole penetrating through the first flexible substrate SUB1. The through hole is open toward the back plate BP and is connected to the opening OP in the back plate BP.

Figure 7B:
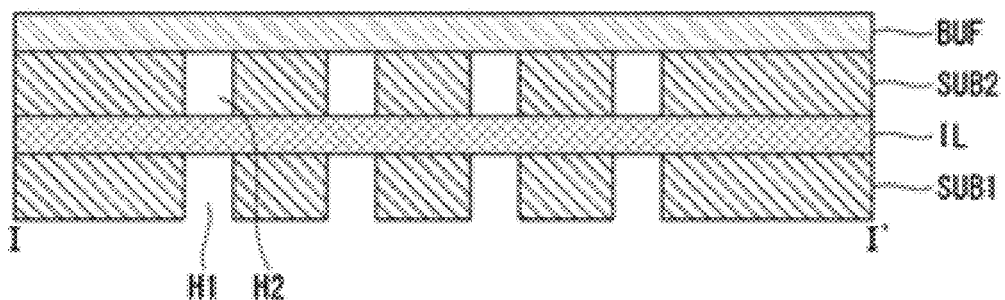

Referring to FIG. 7B, the flexible substrates disposed on the back plate BP include a first flexible substrate SUB1 and a second flexible substrate SUB2 that are disposed opposite each other, with an insulation layer IL interposed therebetween. The first flexible substrate SUB1 is disposed on an upper surface of the back plate BP, and the second flexible substrate SUB2 is disposed under a lower surface of the buffer layer BUF. The first flexible substrate SUB1 is provided with multiple first holes H1 disposed separately from each other. Each of the multiple first holes H1 is formed as a first through hole penetrating through the first flexible substrate SUB1. The first through hole is open toward the back plate BP and is connected to the opening OP in the back plate BP. The second flexible substrate SUB2 is provided with multiple second holes H2 disposed separately from each other. Each of the multiple second holes H2 is formed as a second through hole penetrating through the second flexible substrate SUB2. The second through hole is open toward the insulation layer IL and defines a space made airtight by an upper surface of the insulation layer IL.

Figure 7C:
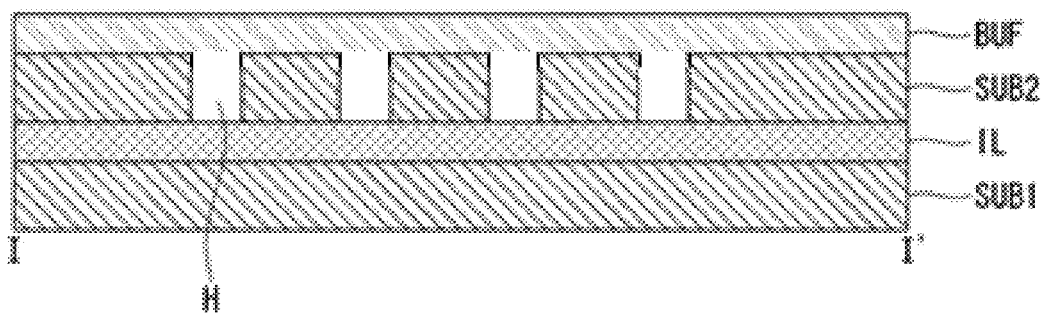

Referring to FIG. 7C, the flexible substrates disposed on the back plate BP include a first flexible substrate SUB1 and a second flexible substrate SUB2 that are disposed opposite each other, with an insulation layer IL interposed therebetween. The first flexible substrate SUB1 is disposed on an upper surface of the back plate BP, and the second flexible substrate SUB2 is disposed under a lower surface of the buffer layer BUF. The second flexible substrate SUB2 is provided with multiple holes H disposed separately from each other. Each of the multiple holes H is formed as a through hole penetrating through the second flexible substrate SUB2. The through hole is open toward the buffer layer BUF and the insulation layer IL, and defines a space made airtight by the lower surface of the buffer layer BUF and an upper surface of the insulation layer IL.

Figure 7D:
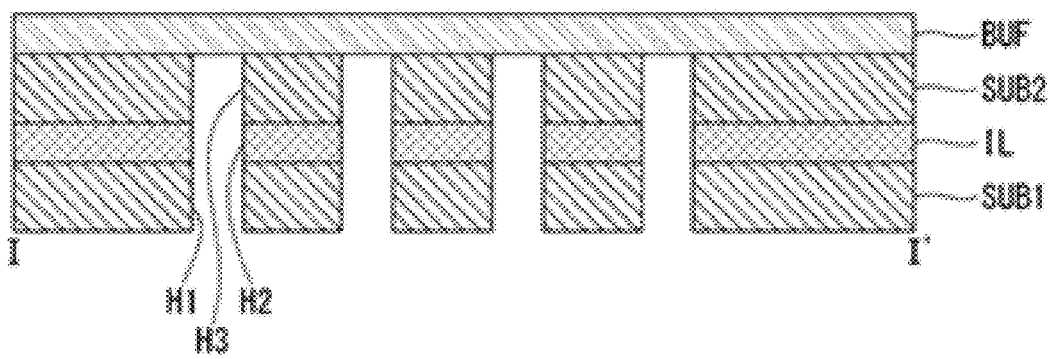

Referring to FIG. 7D, the flexible substrates disposed on the back plate BP include a first flexible substrate SUB1 and a second flexible substrate SUB2 that are disposed opposite each other, with an insulation layer IL interposed therebetween. The first flexible substrate SUB1 is disposed on an upper surface of the back plate BP, and the second flexible substrate SUB2 is disposed under a lower surface of the buffer layer BUF. The first flexible substrate SUB1 is provided with multiple first holes H1 disposed separately from each other. The insulation layer IL is provided with multiple second holes H2 disposed separately from each other. The second flexible substrate SUB2 is provided with multiple third holes H3 disposed separately from each other. The multiple first holes H1, the multiple second holes H2, and the multiple third holes H3 are through holes formed to overlap each other. Therefore, the multiple first holes H1, the multiple second holes HZ and the multiple third holes H3 are connected to the opening OP in the back plate BP.

The third embodiment of FIGS. 7A to 7D shows the examples of the cases where a flexible substrate is formed in a two-layer structure and holes H are formed as through holes, but various combinations other than these are possible. In the third embodiment of FIGS. 7A to 7D, since the holes H are formed as the through holes, the flexible substrate is not present in the region of the holes H. Accordingly, optical properties (superior transmittance, and reduction in color coordinate shift) are superior.

Figure 8A:
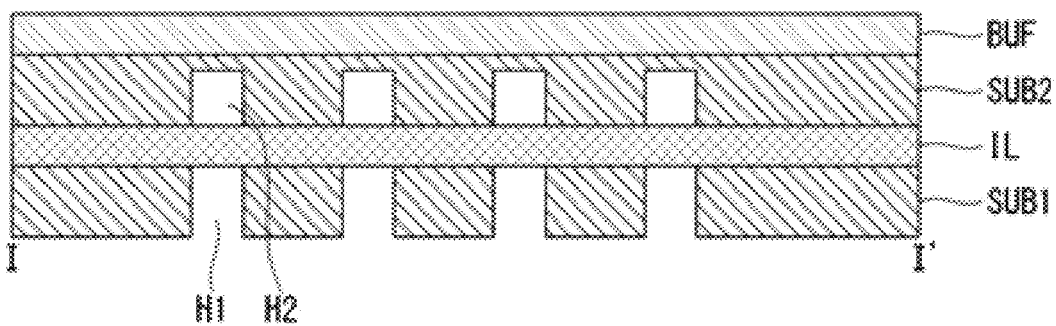
FIGS. 8A to 8C are cross-sectional views showing a fourth embodiment of a substrate and a buffer layer of a display device shown in FIG. 4.
Figure 8B:
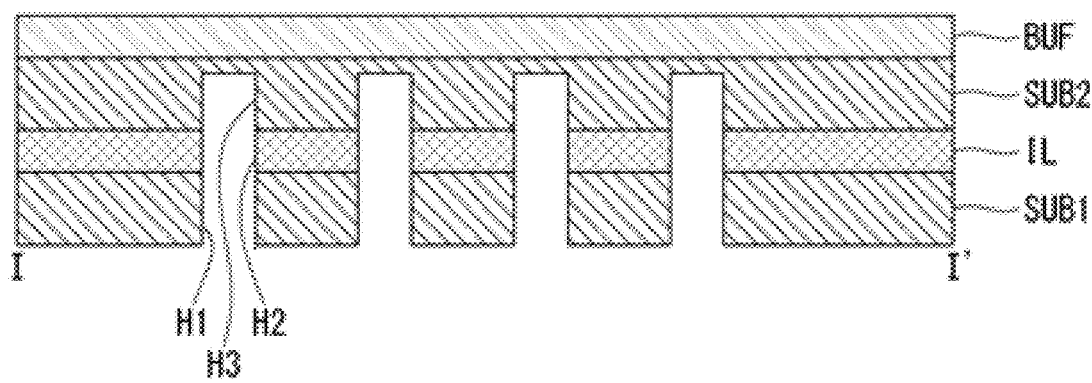
Figure 8C:
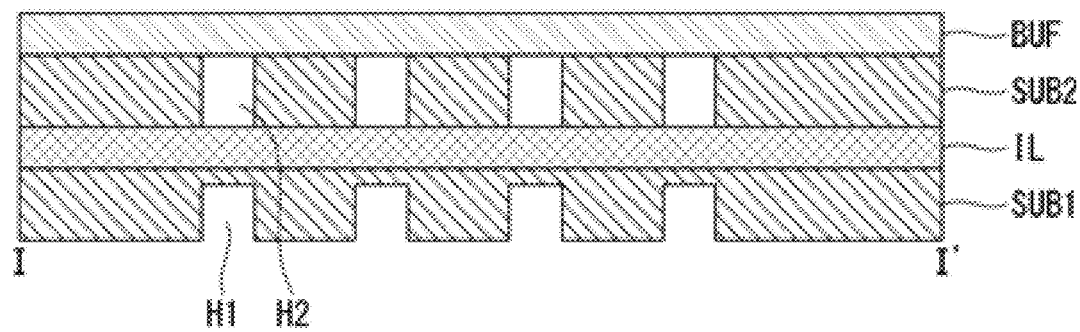

FIGS. 8A to 8C are cross-sectional views showing a fourth embodiment of the substrate and the buffer layer of the display device shown in FIG. 4. FIGS. 8A to 8C show embodiments of the cases where a flexible substrate is formed in a two-layer structure of a first and a second flexible substrate and multiple holes formed in the first and the second flexible substrates are a combination of concave portions and through holes.

Referring to FIG. 8A, the flexible substrates disposed on the back plate BP include a first flexible substrate SUB1 and a second flexible substrate SUB2 that are disposed opposite each other, with an insulation layer IL interposed therebetween. The first flexible substrate SUB1 is disposed on an upper surface of the back plate BP, and the second flexible substrate SUB2 is disposed under a lower surface of the buffer layer BUF. The first flexible substrate SUB1 is provided with multiple first holes H1 disposed separately from each other. Each of the multiple first holes H1 is formed as a through hole penetrating through the first flexible substrate SUB1. The through hole is open toward the back plate BP and is connected to the opening OP in the back plate BP. The second flexible substrate SUB2 is provided with multiple second holes H2 disposed separately from each other. Each of the multiple second holes H2 is formed as a concave portion having a depth less than the thickness of the second flexible substrate SUB2. The concave portion is open toward the insulation layer IL and defines a space made airtight by an upper surface of the insulation layer IL.

Referring to FIG. 8B, the flexible substrates disposed on the back plate BP include a first flexible substrate SUB1 and a second flexible substrate SUB2 that are disposed opposite each other, with an insulation layer IL interposed therebetween. The first flexible substrate SUB1 is disposed on an upper surface of the back plate BP, and the second flexible substrate SUB2 is disposed under a lower surface of the buffer layer BUF. The first flexible substrate SUB1 is provided with multiple first holes H1 disposed separately from each other. The insulation layer IL is provided with multiple second holes H2 disposed separately from each other. The second flexible substrate SUB2 is provided with multiple third holes H3 disposed separately from each other. The multiple first holes H1 and the multiple second holes H2 are through holes formed to overlap each other. The multiple third holes H3 are concave portions each having a depth less than the thickness of the second flexible substrate SUB2, and are disposed to overlap the multiple first holes H1 and the multiple second holes H2. The multiple first holes H1, the multiple second holes HZ and the multiple third holes H3 are connected to the opening OP in the back plate BP.

Referring to FIG. 8C, the flexible substrates disposed on the back plate BP include a first flexible substrate SUB1 and a second flexible substrate SUB2 that are disposed opposite each other, with an insulation layer IL interposed therebetween. The first flexible substrate SUB1 is disposed on an upper surface of the back plate BP, and the second flexible substrate SUB2 is disposed under a lower surface of the buffer layer BUF. The first flexible substrate SUB1 is provided with multiple first holes H1 disposed separately from each other. Each of the multiple first holes H1 is formed as a concave portion having a depth less than the thickness of the first flexible substrate SUB1. The concave portion is open toward the back plate BP and is connected to the opening OP in the back plate BP. The second flexible substrate SUB2 is provided with multiple second holes H2 disposed separately from each other. Each of the multiple second holes H2 is formed as a through hole penetrating through the second flexible substrate SUB2. The through hole is open toward the insulation layer IL and defines a space made airtight by an upper surface of the insulation layer IL and a lower surface of the buffer layer BUF.

The fourth embodiment of FIGS. 8A to 8C shows the examples of the cases where a flexible substrate is formed in a two-layer structure and holes are formed in a combination of concave portions and through holes, and various combinations other than these are possible. In the embodiment of the FIGS. 8A to 8C, the holes positioned in any one among the first and the second flexible substrates overlapping each other are formed as concave portions with the flexible substrate remaining, and the holes positioned in the other flexible substrate are formed as through holes with no flexible substrate remaining. Accordingly, reliability is increased and optical properties (superior transmittance, and reduction in color coordinate shift) are superior, simultaneously.

Hereinafter, with reference to FIGS. 9 and 10, changes in color characteristic depending on the thickness of the flexible substrate of the display device according to an embodiment of the present disclosure will be described.

FIG. 9 is a chromaticity diagram showing changes in color characteristic in cases where the flexible substrate shown in FIG. 4 is provided with holes as in the embodiment of FIGS. 5A to 5C, and in a case where the flexible substrate is not provided with holes. FIG. 10 is a graph and a table showing changes in color coordinates in cases where the flexible substrate is provided with holes as shown in FIGS. 5A to 5C, and in a case where the flexible substrate is not provided with holes.

Referring to FIG. 9, it is found that in the case where the holes H in the flexible substrate SUB are formed as the through holes as shown in FIG. 5C (an embodiment 1 of the present disclosure), the color characteristic is positioned nearby the boundary between red, blue, and green, and shift in color coordinates does not occur (see symbol ♦ in FIG. 9).

It is found that in the case where the holes H in the flexible substrate SUB are formed as the concave portions having the depth less than the thickness of the flexible substrate SUB as shown in FIG. 5A or 5B (an embodiment 2 of the present disclosure), the color characteristic is shifted by Δx1 in the X-axis direction and is shifted by Δy1 in the Y-axis direction (see symbol ▲ in FIG. 9).

In contrast, it is found that in the comparative example which is the case where the flexible substrate SUB is not provided with holes, the color characteristic is shifted by Δx2 in the X-axis direction and is shifted by Δy2 in the Y-axis direction (see symbol ● in FIG. 9).

Figure 10:
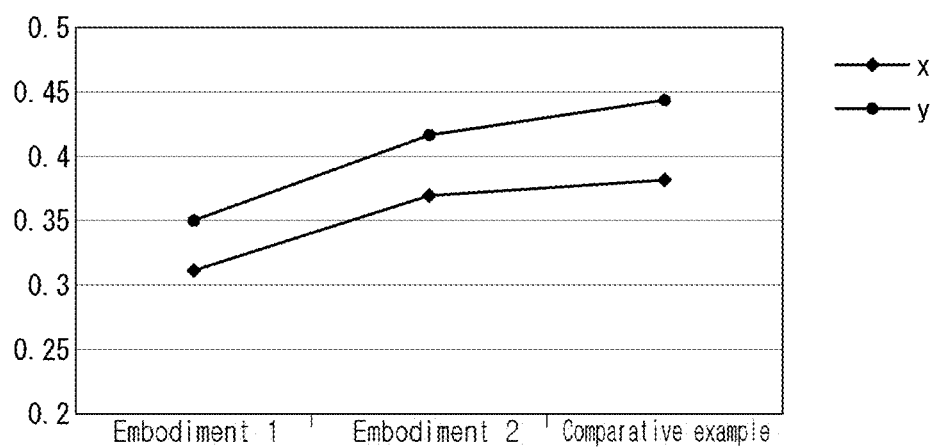
FIG. 10 is a graph and a table showing changes in color coordinates in embodiments 1 and 2 of the present disclosure and the comparative example shown in FIG. 9.

Referring to FIG. 10, color characteristic according to the embodiment 1and the embodiment 2 of the present disclosure, and color characteristics according to the comparative example are different each other. In the graph of FIG. 10, the horizontal axis is an axis representing the embodiment 1, the embodiment 2, and the comparative example, and the vertical axis represents the X-coordinate values (see symbol ♦ in FIG. 10) and the Y-coordinate values (see symbol ● in FIG. 10) in FIG. 9 according to the embodiment 1, the embodiment 2, and the comparative example.

Referring to the table in FIG. 10, it is found that in the embodiment 1 of the present disclosure, there is no shift in the color coordinate of the X axis and the color coordinate of the Y axis, so there is no color change before and after the transmission of light through the flexible substrate. It is found that in the embodiment 2 of the present disclosure, the color coordinate on the X axis is shifted by 0.059 and the color coordinate on the Y axis is shifted by 0.065. It is found that in the comparative example, the color coordinate on the X axis is shifted by 0.071 and the color coordinate on the Y axis is shifted by 0.093.

As described above, compared to the comparative example, in the flexible substrate according to the embodiments 1 and 2 of the present disclosure, the amount of shift in the color coordinate on the X axis and the amount of shift in the color coordinate on the Y axis are significantly reduced, so that the changes in color of light before and after transmission through the flexible substrate is reduced or removed.

In the display device according to the embodiments of the present disclosure described above, the module, such as a camera, a sensor, and the like, is disposed to be received in the opening of the back plate positioned in the display area, so that an increase in size of the bezel part is prevented.

In addition, since the module is received in the opening of the back plate, the module is not exposed to outside, thereby preventing psychological revulsion against an invasion of privacy.

In addition, the multiple holes are formed in the flexible substrate in such a manner to correspond to the opening of the back plate, and the multiple light-transmitting areas are formed in the thin-film transistor and wire formation layer, and the opening, the multiple holes, and the multiple light-transmitting area are disposed to overlap each other, so that the change in color of light entering the module received in the opening of the back plate is reduced and thus sensitivity to light entering the module is increased.

The display device according to the present disclosure may be described as follows.

According to an embodiment of the present disclosure, there is provided a display device including: a flexible substrate including an active area and a bezel area disposed outside the active area, the active area including a module area in which multiple holes are provided; a back plate disposed on one surface of the flexible substrate, and being provided with an opening disposed in a manner that corresponds to the module area; a thin-film transistor and wire formation layer disposed on another surface of the flexible substrate, and including multiple light-transmitting areas disposed in a manner that corresponds to the opening; and a module received within the opening of the back plate, wherein the module receives light from outside through the multiple light-transmitting areas, the multiple holes, and the opening.

In the embodiment, each of the multiple holes may be formed as a concave portion having a depth less than a thickness of the flexible substrate, and the concave portion may be open toward the back plate and may be connected to the opening of the back plate.

In addition, each of the multiple holes may be formed as a concave portion having a depth less than a thickness of the flexible substrate, and the concave portion may be open toward the thin-film transistor and wire formation layer.

In addition, each of the multiple holes may be formed as a through hole penetrating through the flexible substrate, and the through hole may be open toward the back plate (BP) and may be connected to the opening of the back plate.

According to an embodiment of the present disclosure, there is provided a display device including: a back plate including an active area and a bezel area disposed outside the active area, the active area including a module area in which an opening is provided; a first flexible substrate, an insulation layer, and a second flexible substrate sequentially stacked on one surface of the back plate; a thin-film transistor and wire formation layer disposed on one surface of the second flexible substrate, and including multiple light-transmitting areas disposed in a manner that corresponds to the opening; and a module received within the opening of the back plate, wherein at least one among the first flexible substrate and the second flexible substrate is provided with multiple holes that correspond to the multiple light-transmitting areas, respectively, and the module receives light from outside through the multiple light-transmitting areas, the multiple holes, and the opening.

In the embodiment, the first flexible substrate may be disposed on an upper surface of the back plate, and the second flexible substrate may be disposed on a lower surface of the thin-film transistor and wire formation layer. The multiple holes may be formed in the first flexible substrate, each of the multiple holes may be formed as a concave portion having a depth less than a thickness of the first flexible substrate, and the concave portion may be open toward the back plate and may be connected to the opening of the back plate.

In addition, the first flexible substrate may be disposed on an upper surface of the back plate, and the second flexible substrate may be disposed on a lower surface of the thin-film transistor and wire formation layer. The multiple holes may include multiple first holes formed in the first flexible substrate, and multiple second holes formed in the second flexible substrate. Each of the multiple first holes may be formed as a first concave portion having a depth less than a thickness of the first flexible substrate, and the first concave portion may be open toward the back plate and may be connected to the opening of the back plate. Each of the multiple second holes may be formed as a second concave portion having a depth less than a thickness of the second flexible substrate, and the second concave portion may be open toward the insulation layer and may define a space made airtight by an upper surface of the insulation layer.

In addition, the first flexible substrate may be disposed on an upper surface of the back plate, and the second flexible substrate may be disposed under a lower surface of the thin-film transistor and wire formation. The multiple holes may be formed in the second flexible substrate, each of the multiple holes may be formed as a concave portion having a depth less than a thickness of the second flexible substrate, and the concave portion may be open toward the insulation layer and may define a space made airtight by an upper surface of the insulation layer.

In addition, the first flexible substrate may be disposed on an upper surface of the back plate, and the second flexible substrate may be disposed under a lower surface of the thin-film transistor and wire formation. The multiple holes may be formed in the second flexible substrate, each of the multiple holes may be formed as a concave portion having a depth less than a thickness of the second flexible substrate, and the concave portion may be open toward the thin-film transistor and wire formation layer.

In addition, the first flexible substrate may be disposed on an upper surface of the back plate, and the second flexible substrate may be disposed on a lower surface of the thin-film transistor and wire formation layer. The multiple holes may be formed in the first flexible substrate, each of the multiple holes may be formed as a through hole penetrating through the first flexible substrate, and the through hole may be open toward the back plate and may be connected to the opening of the back plate.

In addition, the first flexible substrate may be disposed on an upper surface of the back plate, and the second flexible substrate may be disposed on a lower surface of the thin-film transistor and wire formation layer. The multiple holes may include multiple first holes formed in the first flexible substrate, and multiple second holes formed in the second flexible substrate. Each of the multiple first holes may be formed as a first through hole penetrating through the first flexible substrate, and the through hole may be open toward the back plate and may be connected to the opening of the back plate. Each of the multiple second holes may be formed as a second through hole penetrating through the second flexible substrate, and the second through hole may be open toward the insulation layer and may define a space made airtight by an upper surface of the insulation layer.

In addition, the first flexible substrate may be disposed on an upper surface of the back plate, and the second flexible substrate may be disposed on a lower surface of the thin-film transistor and wire formation layer. The multiple holes may be formed in the second flexible substrate, each of the multiple holes may be formed as a through hole penetrating through the second flexible substrate, and the through hole may be open toward the insulation layer and may define a space made airtight by an upper surface of the insulation layer.

In addition, the first flexible substrate may be disposed on an upper surface of the back plate, and the second flexible substrate may be disposed on a lower surface of the thin-film transistor and wire formation layer. The multiple holes may include multiple first holes formed in the first flexible substrate, multiple second holes formed in the insulation layer, and multiple third holes formed in the second flexible substrate. The multiple first holes, the multiple second holes, and the multiple third holes may be through holes formed to overlap each other, and may be connected to the opening of the back plate.

In addition, the first flexible substrate may be disposed on an upper surface of the back plate, and the second flexible substrate may be disposed on a lower surface of the thin-film transistor and wire formation layer. The multiple holes may include multiple first holes formed in the first flexible substrate, and multiple second holes formed in the second flexible substrate. Each of the multiple first holes may be formed as a through hole penetrating through the first flexible substrate, and the through hole may be open toward the back plate and may be connected to the opening of the back plate. Each of the multiple second holes may be formed as a concave portion having a depth less than a thickness of the second flexible substrate, and the concave portion may be open toward the insulation layer and may define a space made airtight by an upper surface of the insulation layer.

In addition, the first flexible substrate may be disposed on an upper surface of the back plate, and the second flexible substrate may be disposed on a lower surface of the thin-film transistor and wire formation layer. The multiple holes may include multiple first holes formed in the first flexible substrate, multiple second holes formed in the insulation layer, and multiple third holes formed in the second flexible substrate. The multiple first holes and the multiple second holes are through holes formed to overlap each other, and the multiple third holes may be concave portions each having a depth less than a thickness of the second flexible substrate and may be disposed to overlap the multiple first holes and the multiple second holes. The multiple first holes, the multiple second holes, and the multiple third holes may be connected to the opening of the back plate.

In addition, the first flexible substrate may be disposed on an upper surface of the back plate, and the second flexible substrate may be disposed on a lower surface of the thin-film transistor and wire formation layer. The multiple holes may include multiple first holes formed in the first flexible substrate, and multiple second holes formed in the second flexible substrate. Each of the multiple first holes may be formed as a concave portion having a depth less than a thickness of the first flexible substrate, and the concave portion may be open toward the back plate and may be connected to the opening of the back plate. Each of the multiple second may be formed as a through hole penetrating through the second flexible substrate, and the through hole may be open toward the insulation layer.

In addition, according to the embodiments of the present disclosure, the display device may further include: at least one buffer layer disposed between one surface of the thin-film transistor and wire formation layer and the flexible substrate or the second flexible substrate; and a light-emitting element layer disposed on another surface of the thin-film transistor and wire formation layer, and including multiple pixels and a bank dividing the multiple pixels, wherein the bank may be disposed to overlap the multiple light-transmitting areas, the multiple holes, and the opening.

Although the embodiments of the present disclosure have been described in detail with reference to the accompanying drawings, the present disclosure is not limited thereto and may be embodied in many different forms without departing from the technical idea of the present disclosure. Therefore, the embodiments of the present disclosure are provided for illustrative purposes only but not intended to limit the technical idea of the present disclosure. The scope of the technical idea of the present disclosure is not limited thereto. Therefore, it should be understood that the embodiments described above are illustrative in all aspects and not restrictive. The protective scope of the present disclosure should be construed by the following claims, and all the technical ideas in the equivalent scope thereof should be construed as falling within the scope of the present disclosure.

What is claimed is:

1. A display device comprising:
  a flexible substrate including an active area and a bezel area disposed outside the active area, the active area including a module area in which multiple holes are provided;
  a back plate disposed on a first surface of the flexible substrate, and being provided with an opening disposed corresponding to the module area;
  a buffer layer disposed on a second surface of the flexible substrate;
  a thin-film transistor and wire formation layer disposed on the buffer layer, and including a thin-film transistor and wire on the module area and multiple light-transmitting areas disposed corresponding to the multiple holes on the module area;
  a light-emitting element layer including pixels on the opening and a bank layer dividing the pixels and disposed corresponding to the multiple holes;
  an encapsulation layer disposed over the opening;
  a polarizing film disposed over the opening; and
  a module disposed in the opening of the back plate and disposed under the multiple holes,
  wherein the module receives light from outside through the polarizing film, the encapsulation layer, the bank layer, the multiple light-transmitting areas, the multiple holes, and the opening.

2. The display device of claim 1, wherein each of the multiple holes comprises a concave portion having a depth less than a thickness of the flexible substrate, and the concave portion is open toward the back plate and is connected to the opening of the back plate.

3. The display device of claim 1, wherein each of the multiple holes comprises a concave portion having a depth less than a thickness of the flexible substrate, and the concave portion is open toward the thin-film transistor and wire formation layer.

4. The display device of claim 1, wherein each of the multiple holes comprises a through hole penetrating through the flexible substrate, and the through hole is open toward the back plate and is connected to the opening of the back plate.

5. The display device of claim 1, further comprising:
  wherein the bank is disposed to overlap the multiple light-transmitting areas, the multiple holes, and the opening.

6. A display device comprising:
  a back plate including an active area and a bezel area disposed outside the active area, the active area including a module area in which an opening is provided;
  a first flexible substrate, an insulation layer, and a second flexible substrate sequentially stacked on one surface of the back plate;
  a thin-film transistor and wire formation layer disposed on one surface of the second flexible substrate, and including a thin-film transistor and wire on the module area and multiple light-transmitting areas disposed corresponding to the opening on the module area;
  a light-emitting element layer including pixels on the opening and a bank layer dividing the pixels;
  an encapsulation layer disposed over the opening; and
  a module received within the opening of the back plate,
  wherein at least one of the first flexible substrate and the second flexible substrate have multiple holes that correspond to the multiple light-transmitting areas, respectively,
  the module receives light from outside through the encapsulation layer, the bank layer, the multiple light-transmitting areas, the multiple holes, and the opening, and
  wherein the first flexible substrate is disposed on an upper surface of the back plate, and the second flexible substrate is disposed on a lower surface of the thin-film transistor and wire formation layer.

7. The display device of claim 6, wherein the multiple holes are formed in the first flexible substrate, each of the multiple holes comprises a concave portion having a depth less than a thickness of the first flexible substrate, and the concave portion is open toward the back plate and is connected to the opening of the back plate.

8. The display device of claim 6, wherein the multiple holes include multiple first holes formed in the first flexible substrate, and multiple second holes formed in the second flexible substrate,
  each of the multiple first holes comprises a first concave portion having a depth less than a thickness of the first flexible substrate, and the first concave portion is open toward the back plate and is connected to the opening of the back plate, and
  each of the multiple second holes comprises a second concave portion having a depth less than a thickness of the second flexible substrate, and the second concave portion is open toward the insulation layer and defines a space made airtight by an upper surface of the insulation layer.

9. The display device of claim 6, wherein the multiple holes are formed in the second flexible substrate, each of the multiple holes comprises a concave portion having a depth less than a thickness of the second flexible substrate, and the concave portion is open toward the insulation layer and defines a space made airtight by an upper surface of the insulation layer.

10. The display device of claim 6, wherein the multiple holes are formed in the second flexible substrate, each of the multiple holes comprises a concave portion having a depth less than a thickness of the second flexible substrate, and the concave portion is open toward the thin-film transistor and wire formation layer.

11. The display device of claim 6, the multiple holes are formed in the first flexible substrate, each of the multiple holes comprises a through hole penetrating through the first flexible substrate, and the through hole is open toward the back plate and is connected to the opening of the back plate.

12. The display device of claim 6, the multiple holes include multiple first holes formed in the first flexible substrate, and multiple second holes formed in the second flexible substrate,
  each of the multiple first holes comprises a first through hole penetrating through the first flexible substrate, and the first through hole is open toward the back plate and is connected to the opening of the back plate, and
  each of the multiple second holes comprises a second through hole penetrating through the second flexible substrate, and the second through hole is open toward the insulation layer and defines a space made airtight by an upper surface of the insulation layer.

13. The display device of claim 6, the multiple holes are formed in the second flexible substrate, each of the multiple holes comprises a through hole penetrating through the second flexible substrate, and the through hole is open toward the insulation layer and defines a space made airtight by an upper surface of the insulation layer.

14. The display device of claim 6, wherein the multiple holes include multiple first holes formed in the first flexible substrate, multiple second holes formed in the insulation layer, and multiple third holes formed in the second flexible substrate, and
  the multiple first holes, the multiple second holes, and the multiple third holes are through holes formed to overlap each other, and are connected to the opening of the back plate.

15. The display device of claim 6, wherein the multiple holes include multiple first holes formed in the first flexible substrate, and multiple second holes formed in the second flexible substrate,
  each of the multiple first holes comprises a through hole penetrating through the first flexible substrate, and the through hole is open toward the back plate and is connected to the opening of the back plate, and
  each of the multiple second holes comprises a concave portion having a depth less than a thickness of the second flexible substrate, and the concave portion is open toward the insulation layer and defines a space made airtight by an upper surface of the insulation layer.

16. The display device of claim 6, wherein the multiple holes include multiple first holes formed in the first flexible substrate, multiple second holes formed in the insulation layer, and multiple third holes formed in the second flexible substrate,
  the multiple first holes and the multiple second holes are through holes formed to overlap each other, and the multiple third holes are concave portions each having a depth less than a thickness of the second flexible substrate and are disposed to overlap the multiple first holes and the multiple second holes, and
  the multiple first holes, the multiple second holes, and the multiple third holes are connected to the opening of the back plate.

17. The display device of claim 6, wherein the multiple holes include multiple first holes formed in the first flexible substrate, and multiple second holes formed in the second flexible substrate,
  each of the multiple first holes comprises a concave portion having a depth less than a thickness of the first flexible substrate, and the concave portion is open toward the back plate and is connected to the opening of the back plate, and
  each of the multiple second holes comprises a through hole penetrating through the second flexible substrate, and the through hole is open toward the insulation layer.

18. The display device of claim 17, further comprising:
  at least one buffer layer disposed between one surface of the thin-film transistor and wire formation layer and the flexible substrate or the second flexible substrate; and
  a light-emitting element layer disposed on another surface of the thin-film transistor and wire formation layer, and including multiple pixels and a bank dividing the multiple pixels,
  wherein the bank is disposed to overlap the multiple light-transmitting areas, the multiple holes, and the opening.

19. A display device comprising:
  a back plate including an active area and a bezel area disposed outside the active area, the active area including a module area in which an opening is provided;
  a first flexible substrate, an insulation layer, and a second flexible substrate sequentially stacked on one surface of the back plate;
  a buffer layer disposed on one surface of the second flexible substrate;
  a thin-film transistor and wire formation layer disposed on one surface of the buffer layer, and including a thin-film transistor and wire on the module area and multiple light-transmitting areas disposed corresponding to the multiple holes on the module area;
  a light-emitting element layer including pixels on the opening and a bank layer dividing the pixels and disposed corresponding to the multiple holes;
  an encapsulation layer disposed over the opening;
  a polarizing film disposed over the opening; and
  a module disposed in the opening of the back plate and disposed under the multiple holes,
  wherein at least one of the first flexible substrate and the second flexible substrate have multiple holes that correspond to the multiple light-transmitting areas, respectively, and
  wherein the module receives light from outside through the polarizing film, the encapsulation layer, the bank layer, the multiple light-transmitting areas, the multiple holes, and the opening.

20. The display device of claim 19, wherein the first flexible substrate is disposed on an upper surface of the back plate, and the second flexible substrate is disposed on a lower surface of the buffer layer, and
  wherein the multiple holes are in the first flexible substrate, each of the multiple holes comprises a concave portion having a depth less than a thickness of the first flexible substrate, and the concave portion is open toward the back plate and is connected to the opening of the back plate.

* * * * *